(12) United States Patent
Liu et al.

(10) Patent No.: US 12,245,473 B2
(45) Date of Patent: Mar. 4, 2025

(54) DISPLAY PANEL, DISPLAY DEVICE AND MANUFACTURING METHOD THEREOF

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Cong Liu, Beijing (CN); Yao Huang, Beijing (CN); Weiyun Huang, Beijing (CN); Yue Long, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 597 days.

(21) Appl. No.: 17/595,235

(22) PCT Filed: Sep. 24, 2020

(86) PCT No.: PCT/CN2020/117373
§ 371 (c)(1),
(2) Date: Nov. 11, 2021

(87) PCT Pub. No.: WO2022/061639
PCT Pub. Date: Mar. 31, 2022

(65) Prior Publication Data
US 2022/0310727 A1 Sep. 29, 2022

(51) Int. Cl.
*H01L 27/32* (2006.01)
*G09G 3/3225* (2016.01)
(Continued)

(52) U.S. Cl.
CPC ......... *H10K 59/131* (2023.02); *G09G 3/3225* (2013.01); *G09G 3/3266* (2013.01);
(Continued)

(58) Field of Classification Search
CPC .......... H01L 27/124; G09G 2300/0426; G09G 2320/0233; H10K 59/1213
See application file for complete search history.

(56) References Cited

U.S. PATENT DOCUMENTS

| 8,159,117 B2 | 4/2012 | Karaki et al. |
| 2005/0077815 A1 | 4/2005 | Miura |

(Continued)

FOREIGN PATENT DOCUMENTS

| CN | 108010947 A | 5/2018 |
| CN | 108389879 A | 8/2018 |

(Continued)

OTHER PUBLICATIONS

International Search Report and Written Opinion for Application No. PCT/CN2020/117373, dated Jun. 30, 2021, 8 Pages.

(Continued)

*Primary Examiner* — Victoria K. Hall
(74) *Attorney, Agent, or Firm* — BROOKS KUSHMAN P.C.

(57) ABSTRACT

A display panel, a display device and a manufacturing method thereof, and relates to the field of display technology. The display panel includes: a first display area, provided with a plurality of pixel units; a second display area adjacent to the first display area, which is capable of transmitting light and provided with a plurality of light-emitting device units; a pixel auxiliary area external to the first display area and the second display area, which is provided with a plurality of light-emitting driving units;

(Continued)

wherein the light-emitting driving unit is configured to drive the connected light-emitting device unit to emit light.

17 Claims, 6 Drawing Sheets

(51) Int. Cl.

| | | |
|---|---|---|
| G09G 3/3266 | (2016.01) | |
| H01L 51/56 | (2006.01) | |
| H10K 59/121 | (2023.01) | |
| H10K 59/123 | (2023.01) | |
| H10K 59/124 | (2023.01) | |
| H10K 59/131 | (2023.01) | |
| H10K 71/00 | (2023.01) | |
| H01L 27/12 | (2006.01) | |
| H10K 59/12 | (2023.01) | |
| H10K 59/65 | (2023.01) | |
| H10K 102/10 | (2023.01) | |

(52) U.S. Cl.
CPC ......... *H10K 59/121* (2023.02); *H10K 59/123* (2023.02); *H10K 59/124* (2023.02); *H10K 59/1315* (2023.02); *H10K 71/00* (2023.02); *G09G 2300/0439* (2013.01); *G09G 2300/0804* (2013.01); *G09G 2310/0202* (2013.01); *G09G 2310/0281* (2013.01); *G09G 2310/08* (2013.01); *G09G 2320/0233* (2013.01); *H01L 27/124* (2013.01); *H10K 59/1201* (2023.02); *H10K 59/1213* (2023.02); *H10K 59/65* (2023.02); *H10K 2102/103* (2023.02)

(56) References Cited

U.S. PATENT DOCUMENTS

| | | | |
|---|---|---|---|
| 2017/0194402 A1 | 7/2017 | Choi et al. | |
| 2017/0214003 A1 | 7/2017 | Lee et al. | |
| 2018/0166018 A1 | 6/2018 | Yang | |
| 2018/0219058 A1 | 8/2018 | Xiang et al. | |
| 2020/0176539 A1 | 6/2020 | Sung et al. | |
| 2020/0211443 A1 | 7/2020 | Zeng et al. | |
| 2020/0312832 A1 | 10/2020 | Chi et al. | |
| 2020/0411623 A1 | 12/2020 | Cui et al. | |
| 2021/0012706 A1* | 1/2021 | Yang | G09G 3/32 |
| 2021/0043135 A1 | 2/2021 | Zhao et al. | |
| 2021/0158750 A1 | 5/2021 | Xiang et al. | |
| 2021/0201762 A1 | 7/2021 | He | |
| 2021/0225269 A1 | 7/2021 | Yang et al. | |
| 2021/0351227 A1 | 11/2021 | Lius et al. | |
| 2021/0360194 A1 | 11/2021 | Zhao et al. | |
| 2021/0408191 A1 | 12/2021 | Zhao et al. | |
| 2021/0408200 A1 | 12/2021 | Zhoa et al. | |
| 2022/0068211 A1* | 3/2022 | Jeong | H10K 59/131 |
| 2022/0148500 A1 | 5/2022 | Hsieh et al. | |

FOREIGN PATENT DOCUMENTS

| | | |
|---|---|---|
| CN | 108735094 A | 11/2018 |
| CN | 109962092 A | 7/2019 |
| CN | 110232892 A | 9/2019 |
| CN | 110288945 A | 9/2019 |
| CN | 110297365 A | 10/2019 |
| CN | 110459175 A | 11/2019 |
| CN | 110491917 A | 11/2019 |
| CN | 110491918 A | 11/2019 |
| CN | 110690261 A | 1/2020 |
| CN | 110767157 A | 2/2020 |
| CN | 111028757 A | 4/2020 |
| CN | 111048005 A | 4/2020 |
| CN | 111063719 A | 4/2020 |
| CN | 111063720 A | 4/2020 |
| CN | 111179831 A | 5/2020 |
| CN | 111192902 A | 5/2020 |
| CN | 210627870 U | 5/2020 |
| CN | 111293235 A | 6/2020 |
| CN | 111370441 A | 7/2020 |
| CN | 111508377 A | 8/2020 |

OTHER PUBLICATIONS

International Search Report and Written Opinion for Application No. PCT/CN2020/119159, dated Apr. 26, 2021, 10 Pages.
International Search Report and Written Opinion for Application No. PCT/CN2020/119568, dated May 27, 2021, 8 Pages.
Second Office Action for U.S. Appl. No. 17/426,122, dated Feb. 9, 2024, 19 Pages.
Final Office Action for U.S. Appl. No. 17/426,122, dated Jul. 7, 2023, 23 Pages.
First Office Action for Chinese Application No. 202080002091.6, dated Feb. 15, 2023, 6 Pages.
First Office Action for U.S. Appl. No. 17/426,122, dated Jan. 5, 2023, 98 Pages.
Second Final Office Action for U.S. Appl. No. 17/426,122, dated Oct. 31, 2023, 21 Pages.

* cited by examiner

DISPLAY PANEL, DISPLAY DEVICE AND MANUFACTURING METHOD THEREOF

CROSS-REFERENCE TO RELATED APPLICATION

This application is the U.S. national phase of PCT Application No. PCT/CN2020/117373 filed on Sep. 24, 2020, which is incorporated herein by reference in its entirety.

TECHNICAL FIELD

The present disclosure relates to the field of display technology, in particular to a display panel, a display device and a manufacturing method thereof.

BACKGROUND

At present, with the market development demand for full-screen display, integrating the camera under the display panel has become the main direction of the current display device structure design.

For the camera integrated under the display panel, in order to realize the photographing function, the area corresponding to the camera of the display panel is required to be set as a transparent display area. At present, the user's requirements for light transmission and display resolution of the transparent display area are increasing.

However, under the premise of ensuring that the display area has sufficient light transmittance, due to the limitation of trace space, the resolution of the transparent display area is lower than that of a normal display area, which affects the display effect of the transparent display area. Moreover, obvious differences are likely to occur at the junction of the normal display area and the transparent display area. Therefore, in the current under-screen-camera structure, it is difficult to simultaneously satisfy the requirements for light transmission and display resolution.

SUMMARY

Embodiments of the present disclosure provide a display panel, a display device and a manufacturing method thereof, so as to solve the problem that in a display panel using an under-screen-camera in the prior art, it is difficult for the transparent display area corresponding to the camera to simultaneously satisfy the requirements for light transmission and display resolution.

To solve the above technical problems, the embodiments of the present disclosure provide technical solutions as follows:

an aspect provide a display panel, including:
a first display area, which is provided with a plurality of pixel units;
a second display area adjacent to the first display area, which is capable of transmitting light and provided with a plurality of light-emitting device units;
a pixel auxiliary area external to the first display area and the second display area, which is provided with a plurality of light-emitting driving units;
where the light-emitting driving unit is configured to drive the connected light-emitting device unit to emit light.

Optionally, in the display panel, each light-emitting driving unit is correspondingly connected to one of the light-emitting device units; or each light-emitting driving unit is correspondingly connected to at least two of the light-emitting device units.

Optionally, in the display panel, a plurality of the light-emitting driving units are connected in sequence and arranged as at least one unit row extending in a first direction, and each unit row is provided with at least one of the light-emitting driving units;

wherein, the first display area is further provided with a driving input unit corresponding to each unit row, and a driving control signal is input to the light-emitting driving unit in a corresponding unit row through the driving input unit.

Optionally, in the display panel, a plurality of the light-emitting driving units are connected in sequence and arranged as at least one unit column extending in a second direction, and each unit column is provided with at least one of the light-emitting driving units; the first direction intersects with the second direction;

where each cell column is correspondingly connected to a data line, and the data line is used to input a data signal to the light-emitting driving unit in the cell column.

Optionally, in the display panel, each of the data lines surrounds a side edge of the first display area and/or the second display area and is connected to the light-emitting driving unit.

Optionally, in the display panel, a plurality of the light-emitting driving units in each unit row are respectively connected to a plurality of the light-emitting device units in the same row in the second display area in a one-to-one correspondence.

Optionally, in the display panel, a plurality of the light-emitting driving units are arranged into at least two separate unit blocks, and each unit block includes at least one unit row and/or at least one unit column.

Optionally, in the display panel, the light-emitting device unit includes a light-emitting layer and a first terminal and a second terminal located on both sides of the light-emitting layer, and the light-emitting driving unit includes an active layer and a driving electrode connected to the active layer, the driving electrode is connected to the first terminal through a connecting wire; where the distance between the first terminal and the driving electrode is smaller than the distance between the second terminal and the driving electrode.

Optionally, in the display panel, the connecting wire includes at least two wiring layers located in different layers, wherein a first insulating layer is provided between the first terminal and the wiring layer, and a second insulating layer is provided between the wiring layer and the driving electrode;

The first electrode is connected to one of the wiring layers through a via hole penetrating the first insulating layer, and the corresponding connected wiring layer is connected to the driving electrode through a via hole penetrating the second insulating layer.

Optionally, in the display panel, a wiring adjustment layer is deposited between the first terminal and a connected first wiring layer on the first wiring layer of the plurality of wiring layers, and the wiring adjustment layer and the second wiring layer above the first wiring layer are made by a same patterning process.

Optionally, in the display panel, each unit row is connected to one of the driving input units through a driving wire group, and the driving wire group includes at least two connecting wires for inputting a gate control signal, a reset control signal, and an EM control signal to the light-emitting driving unit in the cell row.

Optionally, in the display panel, the light-emitting driving unit includes a first gate and a first electrode connected to the first gate; the driving input unit includes a second gate and a second electrode connected to the second gate;

the connecting wire includes at least two wiring layers located in different layers, wherein insulating layers are respectively provided between the first electrode and the wiring layer and between the second electrode and the wiring layer;

the first electrode and the second electrode are connected through one of the wiring layers, and the corresponding wiring layer penetrates the insulating layer to connect the first electrode and the second electrode, respectively.

Optionally, in the display panel, the driving input unit further includes a third electrode, where the second electrode is connected to the second gate through the third electrode.

Optionally, in the display panel, the connecting wire is made of a transparent conductive material.

Optionally, in the display panel, the first display area surrounds the second display area, and the pixel auxiliary area is provided at one side edge of the first display area.

In an aspect, a display device is further provided, which includes the display panel as described in any one of the above.

In one aspect, a manufacturing method of the display panel as described in any one of the above is further provided, the method includes:

providing a transparent base substrate;

preparing a plurality of pixel units in a first area of the base substrate to form a first display area; preparing a plurality of transparent light-transmitting device units in a second area of the base substrate to form a second display area; and preparing a plurality of light-emitting driving units in a third area of the base substrate to form a third display area, and the light-emitting driving units are used to drive the connected light-emitting device units to emit light.

BRIEF DESCRIPTION OF THE DRAWINGS

In order to illustrate the technical solutions of the embodiments of the present disclosure or the related art in a clearer manner, drawings used in description of the embodiments will be briefly introduced hereinafter. Obviously, the following drawings merely relate to some embodiments of the present disclosure, and based on these drawings, a person skilled in the art may obtain the other drawings without any creative effort.

DETAILED DESCRIPTION

In order to make the technical problems, the technical solutions and the advantages of the embodiments of the present disclosure more apparent, the present disclosure will be described hereinafter in a clear and complete manner in conjunction with the drawings and embodiments.

Figure 1:
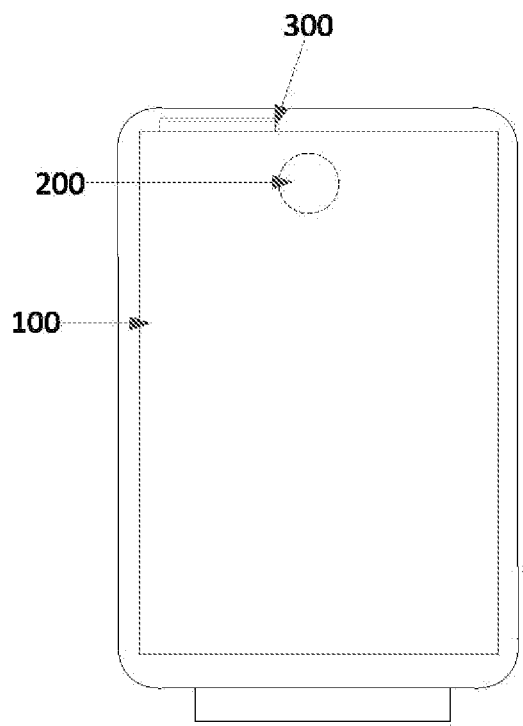
FIG. 1 is a schematic view showing an external appearance of a display panel according to the present disclosure.
Figure 2:
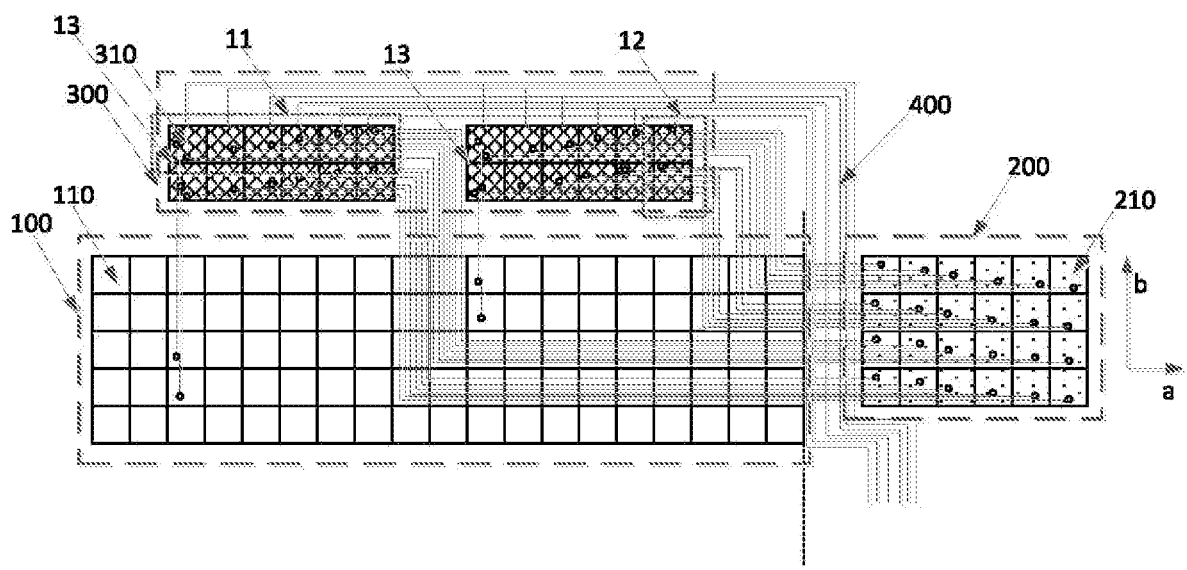
FIG. 2 is a schematic view showing a connection structure of a first embodiment of the display panel according to the present disclosure.

Referring to FIGS. 1 and 2, the present disclosure provides in some embodiments a display panel, which includes:

a first display area 100, provided with a plurality of pixel units 110;

a second display area 200 adjacent to the first display area 100, which is capable of transmitting light and provided with a plurality of light-emitting device units 210;

a pixel auxiliary area 300 external to the first display area 100 and the second display area 200, which is provided with a plurality of light-emitting driving units 310;

wherein the light-emitting driving unit 310 is configured to drive the connected light-emitting device unit 210 to emit light.

In the embodiments of the present disclosure, as shown in FIG. 1, the first display area 100 and the second display area 200 are combined to form at least a part of the display area of the display panel, and optionally, form the entire display area of the display panel.

Optionally, the display panel is an OLED display panel, the light-emitting device unit 210 is an OLED light-emitting unit in an OLED pixel unit, and the light-emitting driving unit 310 is a driving unit for driving the OLED light-emitting unit to emit light.

In the embodiment of the present disclosure, optionally, the display panel includes a transparent base substrate, the pixel unit 110, the light-emitting device unit 210, and the light-emitting driving unit 310 are all formed on the transparent base substrate, and the light-emitting device unit 210 is made of a light-transmitting material and is formed to have a light-transmitting structure, so that the second display area 200 is formed as a transparent display area. Optionally, the light-emitting device unit 210 is not limited to only being made of light-transmitting materials, and may also utilize the light transmittance function of the gap between the spaced light-emitting device unit 210 to form the light transmitting effect of the second display area 200.

In the embodiment of the present disclosure, optionally, the first display area 100 surrounds the second display area 200, or the second display area 200 is provided on one of the edges of the first display area 100. Optionally, the pixel unit 110 provided in the first display area 100 may be made of a light-transmitting material, or may not be made of a light-transmitting material, which is not limited herein.

In the display panel adopting this implementation structure, a camera can be provided on the side of the second display area 200 far away from the display panel. By using the light-transmitting function of the second display area 200, light incident on the display panel can be transmitted to the camera for image capturing. In addition, since the second display area 200 is further provided with the light-emitting device unit 210, the light-emitting driving unit 310 of the pixel auxiliary area 300 can drive the light-emitting device unit 210 to emit light, so the second display area 200 can also be used to realize image display.

Since in this embodiment, the light-emitting driving unit 310 for driving the light-emitting device unit 210 of the second display area 200 to emit light is provided external to the first display area 100 and the second display area 200, so that the area for providing the corresponding camera includes only the light-emitting device unit 210, and the distribution density of the connecting wires that connect the light-emitting device unit 210 and the light-emitting driving unit 310 in the display area is reduced. Therefore, with the same area, the display panel according to the embodiment of the present invention can increase a number of the light-emitting device units 210 and can prevent the light transmittance from being affected by the setting of the connecting wires, so that the requirements for light transmission and display resolution can be simultaneously satisfied.

In this embodiment, the connecting wire connecting the light-emitting device unit 210 and the light-emitting driving unit 310, and the connecting wire connecting the pixel unit 110 and the light-emitting driving unit 310 do not overlap as much as possible.

In the embodiments of the present disclosure, the shape of the second display area 200 is one of a quadrilateral and a circle, but it is not limited to only a quadrilateral and a circle.

Optionally, the first display area 100 surrounds the second display area 200, and the second display area 200 is provided close to the uppermost edge position when the display panel displays images, and the camera set corresponding to the second display area 200 is formed as a front camera.

Optionally, the pixel auxiliary area 300 is provided at one side edge of the first display area 100. As shown in FIG. 1, the setting area of the pixel auxiliary area 300 is located at one of the edges of the entire display area of the display panel, for example, in an upper position of the display panel.

In the embodiments of the present disclosure, in order to reduce the effect of the pixel auxiliary area 300 being located on the top of the display panel on the frame size of the display panel, the plurality of light-emitting driving units 310 provided in the pixel auxiliary region 300 may be distributed in a plurality of unit blocks 13. Each unit block 13 includes M*N light-emitting driving units 310, M and N are both positive integers greater than or equal to 1, and there is a separation space between adjacent unit blocks. In this way, by reducing the space occupied by the light-emitting driving unit 310 in the up-down direction (the second direction b in FIG. 2) on the upper position of the display panel, the effect of the pixel auxiliary area 300 on the frame size of the display panel is reduced.

As shown in FIG. 2, in the embodiments of the present disclosure, one light-emitting driving unit 310 is correspondingly connected to one light-emitting device unit 210, or one light-emitting driving unit 310 is correspondingly connected to at least two light-emitting device units 210; the light-emitting device unit 210 is driven to emit light by the connected light-emitting driving unit 310.

Further, optionally, as shown in FIG. 2, a plurality of the light-emitting driving units 310 are connected in sequence and arranged as at least one unit row 11 extending in a first direction a, and each unit row 11 is provided with at least one of the light-emitting driving units 310;

the first display area 100 is further provided with a driving input unit corresponding to each unit row 11, and a driving control signal is input to the light-emitting driving unit 310 in a corresponding unit row 11 through the driving input unit.

Optionally, as shown in FIG. 2, a plurality of the light-emitting driving units 310 are arranged into at least two separate unit blocks 13, and each unit block 13 includes at least one unit row 11 and/or at least one unit column 12, and form as a structure of M*N light-emitting driving units 310 arranging in sequence. Optionally, each unit block 13 includes two or three unit rows 11, but it is not limited to only two or three unit rows 11, and it can be specifically designed according to the size and area design requirements of the second display area 200, and the size and area design requirements of the upper frame of the display panel.

In the embodiments of the present disclosure, optionally, as shown in FIG. 2, a plurality of the light-emitting driving units 310 in each unit row 11 are respectively connected to a plurality of the light-emitting device units 210 in the same row in the second display area 200 in a one-to-one correspondence.

Optionally, the light-emitting device unit 210 located in the same pixel row as the driving input unit is connected to the light-emitting driving unit 310 in the unit row 11 corresponding to the driving input unit in a one-to-one correspondence, so as to be able to maintain the uniformity of displaying image on the same pixel row of the first display area 100 and the second display area 200. Optionally, when the plurality of light-emitting driving units 310 are arranged into at least two separate unit blocks 13, each unit row 11 in each unit block 13 corresponds to the light-emitting device unit 210 in one row, and the plurality of light-emitting driving units 310 in this unit row 11 are respectively connected to the plurality of light-emitting device units 210 in the corresponding row in a one-to-one correspondence. By adopting this method, the regularity of the connecting wire during the manufacture of the display panel can be guaranteed, and the effect of reducing the distribution area can be achieved.

In the embodiment of the present disclosure, optionally, a plurality of the light-emitting driving units 310 are connected in sequence and arranged as at least one unit column 12 extending in a second direction b, and each unit column 12 is provided with at least one of the light-emitting driving units 310; the first direction a intersects with the second direction b; optionally, the first direction a is perpendicular to the second direction b;

wherein each cell column 12 is correspondingly connected to a data line 400, and the data line 400 is used to input a data signal to the light-emitting driving unit 310 in the cell column 12.

Optionally, each of the data lines 400 surrounds a side edge of the first display area 100 and/or the second display area 200 and is connected to the light-emitting driving unit 310.

Wherein, in this embodiment, the data line 400 is drawn from the side of the second display area 200 and a position between the first display area 100 and the second display area 200 to the light-emitting driving unit 310.

Optionally, the driving unit in the pixel unit 110 of the first display area 100 is multiplexed as a driving input unit for inputting a driving control signal to the light-emitting device unit 210.

Specifically, the driving electrode (for example, source/drain) in the pixel unit 110 is connected to the driving electrode of the light-emitting driving unit 310 in one of the cell rows, and inputs the driving control signal to the light-emitting driving unit in the corresponding cell row.

Among them, the light-emitting device unit 210 located in the same pixel row as the pixel unit 110 is connected to the light-emitting driving unit 310 in the unit row 11 correspondingly connected to the pixel unit 110 in a one-to-one correspondence.

With the display panel according to this embodiment, the light-emitting driving unit 310 of the pixel auxiliary area 300 is inputted with a driving control signal by the driving electrode of the pixel unit 110, and a data signal by the data line 400, and the connected light-emitting device unit 210 is controlled to emit light, so that the second display area 200 can realize image display.

In the embodiment of the present disclosure, the plurality of the pixel units 110 provided in the first display area 100 are arranged and connected in sequence. Optionally, the plurality of the light-emitting device units 210 provided in the second display area 200 may also be arranged and connected in sequence, with the same setting density with the plurality of pixel units 110, and are formed as a transparent display area with high pixel density (Pixels per inch, PPI) in the area corresponding to the camera. At the same time, it avoids the problem that there are a large number of slits in the second display area, which easily cause a large amount of interference and diffraction of lights, causing glare, and reducing the imaging quality of the camera.

Figure 3:
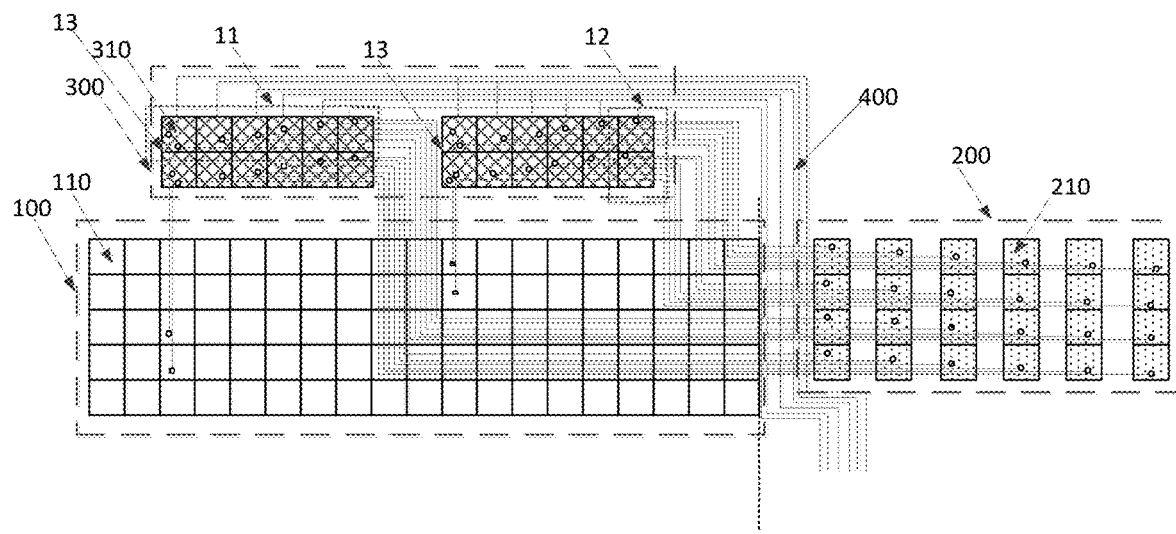
FIG. 3 is a schematic view showing a connection structure of a second embodiment of the display panel according to the present disclosure.

Of course, the plurality of the light-emitting device units 210 in the second display area 200 are not limited to being arranged in sequence, and can also has a structure of arranging at intervals, form as a light-transmitting display area of a low-PPI corresponding to the camera as shown in FIG. 3, so as to meet the requirements of higher light transmittance.

According to the above, in the embodiment of the present disclosure, the light-emitting driving unit 310 of the pixel auxiliary area 300 is connected to the light-emitting device unit 210 of the second display area 200 and the driving input unit of the first display area 100. The above connection in the display panel according to the embodiments of the present disclosure will be described below with reference to the drawings.

Figure 4:
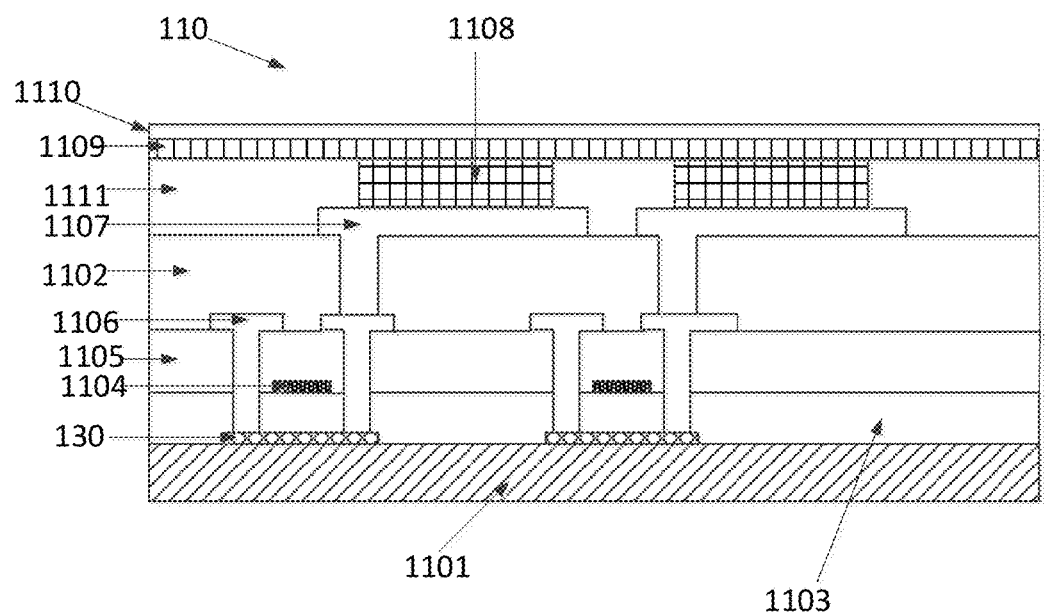
FIG. 4 is a schematic sectional view of a pixel unit.

FIG. 4 is a schematic sectional view of a pixel unit portion of FIG. 2, i.e., a schematic sectional view of the pixel unit 110;

Optionally, it is taken as an example that the display panel is a top emission type OLED display panel, as shown in FIG. 4, and in connection with FIG. 2, in the first display area 100, the pixel unit 110 of the display panel includes a substrate 1101 and a driving unit and a light-emitting device unit provided on the substrate 1101. The driving unit includes a first active layer 130, a gate insulating layer 1103 (which may include a first gate insulating layer and a second gate insulating layer), a gate layer 1104, a interlayer insulating layer 1105 and source/drain layer 1106 that sequentially formed on the substrate 1101; the light-emitting device unit includes a first terminal 1107, and a first light-emitting layer 1108 provided on one side of the first terminal 1107 away from the substrate 1101 and a second terminal 1109 provided on a side of first light-emitting layer 1108 away from the substrate 1101. Optionally, a spacer layer 1110 is further provided on the second terminal 1109. Wherein, the pixel defining layer 1111 is provided on the first terminal 1107, and the first light-emitting layer 1108 is provided in the pixel defining layer 1111. Optionally, the spacer layer 1110 includes two opposing inorganic layers and an organic layer between the two inorganic layers.

The first terminal 1107 is connected to the source/drain layer 1106 through a via hole of the flat layer 1102, and the light-emitting device can be driven by the drive unit to emit light.

In the embodiments of the present disclosure, optionally, the first terminal 1107 is an anode, and the second terminal 1109 is a cathode. The first light-emitting layer 1108 includes a hole injection layer, a hole transport layer, a light-emitting layer, an electron transport layer, and an electron injection layer provided sequentially.

Optionally, the substrate 1101 can be a transparent layer, including a plurality of spaced organic layers and inorganic layers.

It should be appreciated that a barrier layer and a buffer layer or the like may be provided between the substrate 1101 and the first active layer 130, which is not described in detail here.

In the embodiments of the present disclosure, based on the setting structure of the pixel unit 110 of the first display area 100, the structure of the light-emitting device unit 210 of the second display area 200 may be the same as the structure of the light-emitting device unit of the pixel unit 110, and the included respective functional layers are the same layer.

Among them, in the pixel auxiliary area 300, the light-emitting driving unit 310 includes a driving electrode, and is connected to the first terminal (anode) of the light-emitting device unit 210 via a connecting wire. Optionally, the driving electrode of the light-emitting driving unit 310 and the source/drain layer 1106 of the pixel unit 110 are provided in the same layer, and optionally, can be made by the same patterning process.

Optionally, the connecting wire for the connection between the driving electrode of the light-emitting driving unit 310 and the first terminal of the light-emitting device unit 210 is a circuit group including at least two wiring layers located in different layers, and the adjacent wiring layers is separated by an insulating layer. In this embodiment, the circuits are separated by a multi-layer flat layer. Using multi-layer connecting lines, based on the limitation of the trace space, the number of controllable light-emitting device units 210 can be increased, so as to effectively improve the resolution of the transparent display area and ensure the display effect of the second display area.

It should be noted that in the light-emitting device unit 210 of the embodiments of the present disclosure, the distance between the first terminal and the driving electrode is smaller than the distance between the second terminal and the driving electrode. Taking the first terminal of the light-emitting device unit 210 close to the light-emitting driving unit 310 being an anode as an example, the structure of the display panel of the embodiment of the present disclosure will be described in detail, but the first terminal is not limited to only being an anode, for example, it may also be a cathode.

Figure 5:
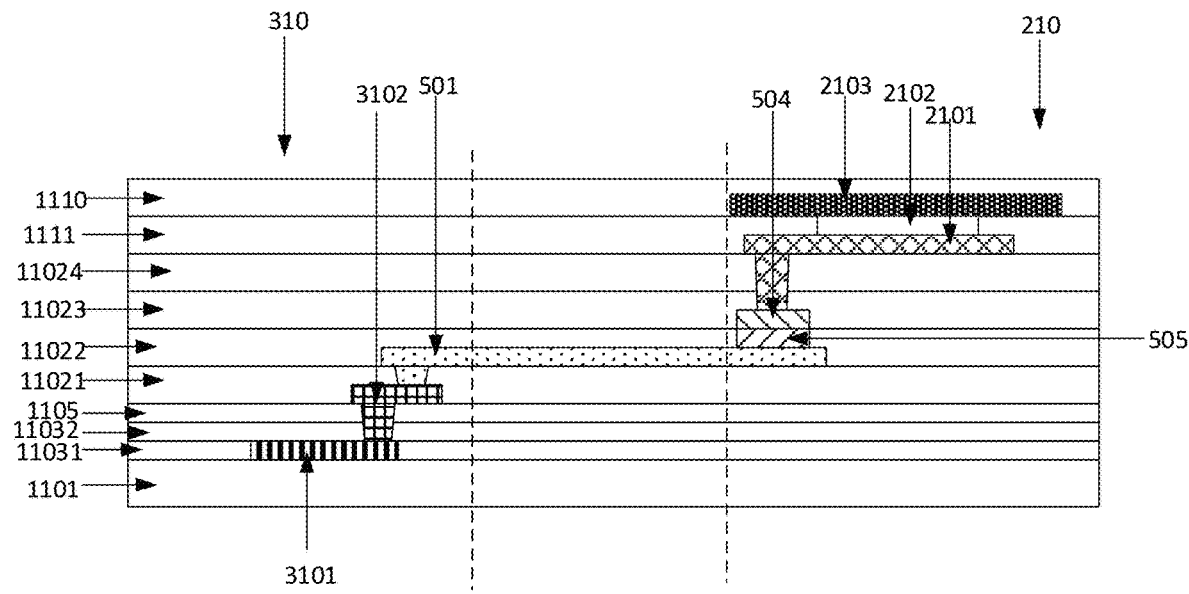
FIGS. 5 to 7 are schematic sectional views illustrating the connection between the light-emitting driving unit and the light-emitting device unit.
Figure 6:
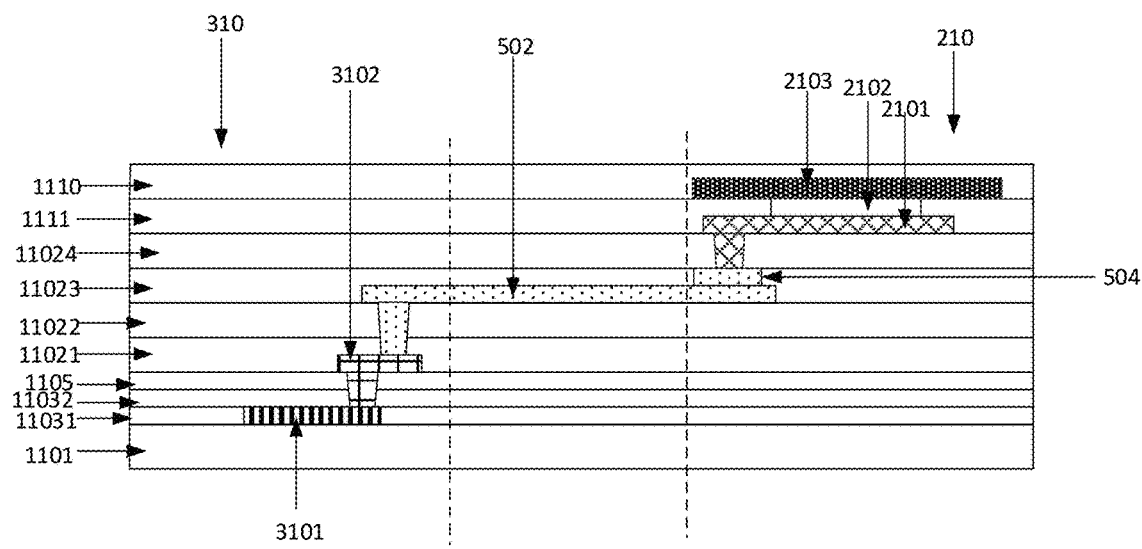
Figure 7:
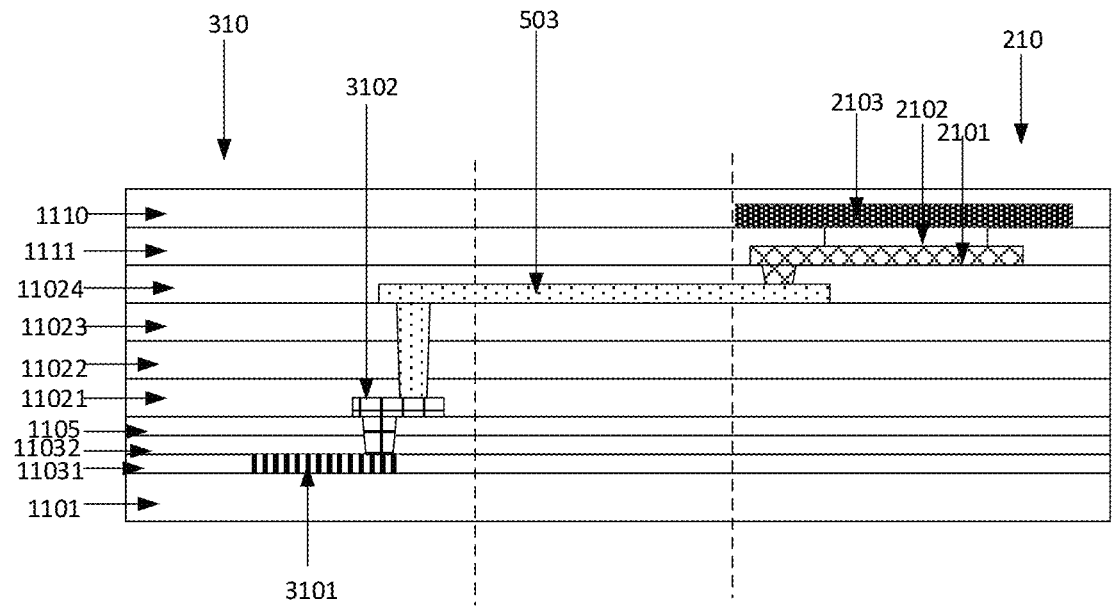

FIGS. 5 to 7 are schematic sectional views for illustrating the connection between the light-emitting driving unit 310 and the light-emitting device unit 210;

Specifically, the second display area 200 and the pixel auxiliary area 300 respectively include a first gate insulating layer 11031, a second gate insulating layer 11032, an interlayer insulating layer 1105, and a first flat layer 11021, a second flat layer 11022, a third flat layer 11023, a fourth flat layer 11024, a pixel defining layer 1111, and a spacer layer 1110 which are sequentially disposed on the substrate 1101 and respectively in the same layer of the corresponding layer of the first gate insulating layer 11031, the second gate insulating layer 11032, the interlayer insulating layer 1105, the first flat layer 11021, the second flat layer 11022, the third flat layer 11023, the fourth flat layer 11024, the pixel defining layer 1111, and the spacer layer 1110 of the first display area 100, and optionally, they can be made using the same patterning process.

Wherein, the light-emitting driving unit 310 of the pixel auxiliary area 300 includes:

a second active layer 3101 formed on the substrate 1101. It can be understood that a buffer layer may be provided on the substrate 1101, and the second active layer 3101 is usually formed on the buffer layer; wherein, the first gate insulating layer 11031 is provided on the second active layer 3101; and the second active layer 3101 is in the same layer as the first active layer 130 of the pixel unit 110 in the first display area 100, and optionally, can be formed by the same patterning process;

a driving electrode 3102 formed on the interlayer insulating layer 1105, wherein the first flat layer 11021 is formed on this driving electrode 3102; and this driving electrode 3102 and the source/drain layer 1106 of the pixel unit 110 in the first display area 100 are the same layer, and optionally, can be formed by the same patterning process. The driving electrode 3102 is connected to the second active layer 3101 through a via hole that penetrates the interlayer insulating layer 1105, the first gate insulating layer 11031 and the second gate insulating layer 11032 in sequence.

Wherein, the light-emitting device unit 210 of the pixel auxiliary area 200 includes:

an anode 2101 formed on the fourth flat layer 11024; where the anode 2101 is in the same layer as the first terminal 1107 of the pixel unit 110 in the first display area 100; and the pixel defining layer 1111 is formed on the anode 2101;

a second light-emitting layer 2102 formed on the anode 2102; where the second light-emitting layer 2102 is the same layer as the first light-emitting layer 1108 of the pixel unit 110 in the first display area 100;

a cathode 2103 formed on the second light-emitting layer 2102; where the cathode 2103 is in the same layer as the second terminal 1109 of the pixel unit 110 in the first display area 100.

The light-emitting driving unit 310 and the light-emitting device unit 210 based on the above-mentioned implementation structure are shown in FIGS. 5 to 7. In this embodiment, the connecting wire connecting the driving electrode 3102 of the light-emitting driving unit 310 and the anode 2101 of the light-emitting device unit 210 includes a first wiring layer 501 located on the first flat layer 11021, a second wiring layer 502 located on the second flat layer 11022, and a third wiring layer 503 located on the third flat layer 11023. In this embodiment, the connecting wire including three wiring layers is taken as an example, but it is not limited to only including three wiring layers, for example, two, four wiring layers or more wiring layers can also be included.

With this implementation structure, the connecting wire includes at least two wiring layers located in different layers, a first insulating layer is provided between the first terminal and the wiring layer, and a second insulating layer is arranged between the wiring layer and the driving electrode. The first terminal is connected to one of the wiring layers through a via hole penetrating the first insulating layer, and the correspondingly connected wiring layer is connected to the driving electrode through a via hole penetrating the second insulating layer. The driving electrodes are connected. That is, the first poles of different light-emitting device units 210 may be extended to connect to the driving electrodes 3102 of the light-emitting driving unit 310 through wiring layers located in different layers.

Specifically, taking the first terminal being an anode as an example, the anode 2101 penetrates the via hole of the fourth flat layer 11024 (the first insulating layer) and is connected to the third wiring layer 503; in the embodiment of the present disclosure, in part of the light-emitting device units 210, the anode 2101 penetrates the fourth flat layer 11024 and is connected to the third wiring layer 503, and the anode 2101 is connected to the driving electrode 3102 through the via hole of the third wiring layer that penetrates the third flat layer 11023, the second flat layer 11022, and the first flat layer 11021 (second insulating layer) in sequence, as shown in FIG. 7;

In part of the light-emitting device units 210, the anode 2101 penetrates through the via hole on the fourth flat layer 11024 and is connected to a first wiring adjustment layer 504. The first wiring adjustment layer 504 is provided on the second wiring layer 502, by the second wiring layer 502 passing through the via holes located in the second flat layer 11022 and in the first flat layer 11021 in sequence, the anode 2101 is connected to the driving electrode 3102, as shown in FIG. 6; in this implementation structure, the first wiring adjustment layer 504 may be provided in the third flat layer 11023, optionally, it can be made by the same patterning process as the third wiring layer 503 for connecting the second wiring layer 502 and the anode 2101. Setting the first wiring adjustment layer 504 can avoid a risk of being etched away due to the thickness of the second wiring layer 502 being too small in the forming process;

In part of the light-emitting device units 210, the anode 2101 penetrates through the via hole on the fourth flat layer 11024 and the third flat layer 11023 and is connected to the first wiring adjustment layer 504. The first wiring adjustment layer 504 is provided on the second wiring adjustment layer 505, and the second wiring adjustment layer 505 is provided on the first wiring layer 501. By the first wiring layer 501 passing through the via holes located in the first flat layer 11021, the anode 2101 is connected to the driving electrode 3102, as shown in FIG. 5; in this implementation structure, the first line adjustment layer 504 may be provided in the third flat layer 11023, and the second wiring adjustment layer 505 may be disposed in the second flat layer 11022. Optionally, the first wiring adjustment layer 504 and the third wiring layer are made by the same patterning process, and the second wiring adjustment layer 505 and the second wiring layer 502 are made by the same patterning process. Through the arrangement of the first wiring adjustment layer 504 and the second wiring adjustment layer 505, the risk of the first wiring layer 501 being etched away due to the too small thickness during the forming process is avoided.

In this embodiment, according to the above, when a second wiring layer is further provided above the wiring layer (for example, the first wiring layer) connected to the anode 2101, a wiring adjustment layer can be deposited between the anode 2101 and the connected wiring layer to avoid the risk of the connected wiring layer being easily etched away. Optionally, the wiring adjustment layer and the second wiring layer are made by the same patterning process, which can achieve the purpose of simplifying the forming process.

Furthermore, in the above-mentioned embodiments of the present disclosure, when the plurality of light-emitting driving units 310 and the plurality of light-emitting device units 210 are connected in a one-to-one correspondence through the connecting wires, part of the light-emitting driving units 310 and the light-emitting device units 210 are extended and connected through the first wiring layer 501, part of the light-emitting driving units 310 and the light-emitting device units 210 are extended and connected through the second wiring layer 502, and part of the light-emitting driving units 310 and the light-emitting device units 210 are extended and connected through the third wiring layer 503, in order to achieve a multi-layer connection, which can increase the number of light-emitting device units 210 that can be controlled, and effectively improve the resolution of the transparent display area.

In the embodiments of the present disclosure, optionally, the connecting wires connecting the plurality of light-emitting driving units 310 and the plurality of light-emitting device units 210 are made of transparent conductive materials, that is, the above-mentioned first wiring layer 501, second wiring layer 502, the third wiring layer 503, the first wiring adjustment layer 504, and the second wiring adjustment layer 505 are all made of transparent conductive materials, such as ITO and/IZO.

Figure 8:
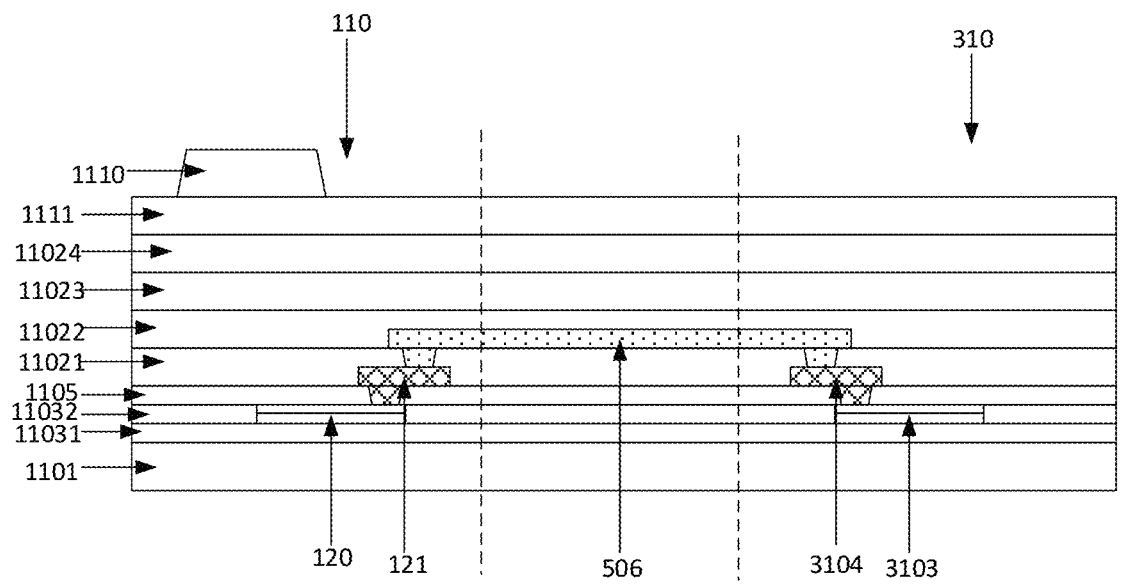
FIGS. 8 to 10 are schematic sectional views illustrating the connection between the light-emitting driving unit and the pixel unit.
Figure 9:
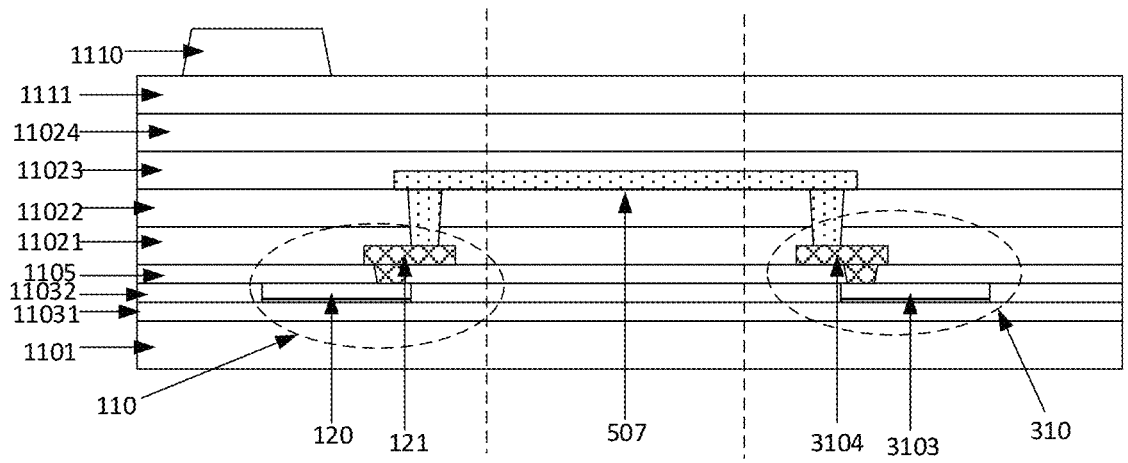
Figure 10:
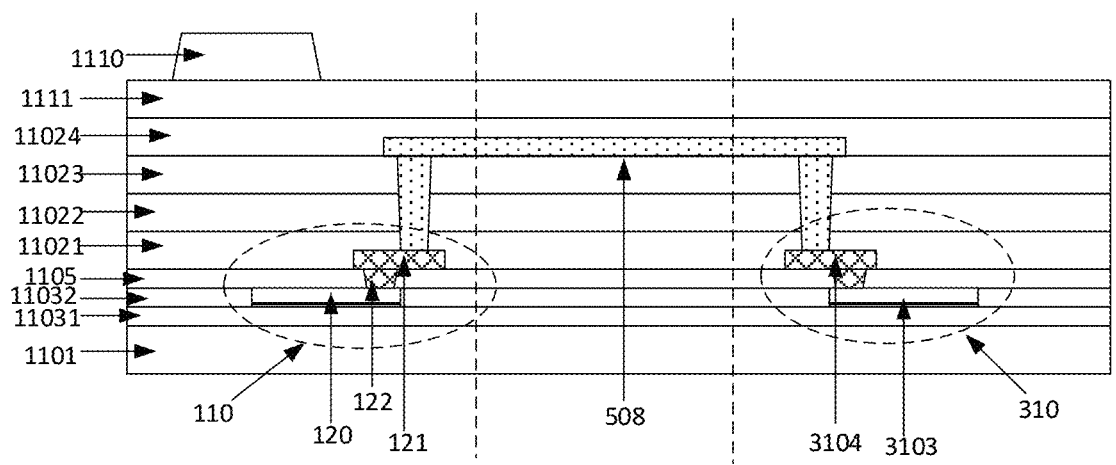

FIGS. 8 to 10 are schematic sectional views for illustrating the connection between the driving input unit of the first display area and the light-emitting driving unit 310;

As shown in FIG. 2 and FIG. 3, among the plurality of light-emitting driving units 310, each unit row 11 is connected to one driving input unit. Specifically, each unit row 11 is connected to one driving input unit through a driving wire group, and the driving wire group includes at least two connecting wires for inputting a gate control signal, a reset control signal, and an EM control signal to the light-emitting driving unit 310 in the cell row 11.

As shown in FIGS. 8 to 10, taking that one of the gate control signal, reset control signal, and EM control signal is input to the light-emitting driving unit in the unit row 11 through a connecting wire between the driving input unit and the light-emitting driving unit 310, the control signal as an example, the connection between the driving input unit and the light-emitting driving unit 310 is illustrated.

With reference to FIGS. 8-10, the first display area 100 and the pixel auxiliary area 300 respectively include a first gate insulating layer 11031, a second gate insulating layer 11032, an interlayer insulating layer 1105, a first flat layer 11021, a second flat layer 11022, a third flat layer 11023, a fourth flat layer 11024, a pixel defining layer 1111, and a spacer layer 1110 which are sequentially disposed on the substrate 1101, where the light-emitting driving unit 310 further includes:
a first gate 3103 formed on the first gate insulating layer 11031, and the second gate insulating layer 11032 is formed on the first gate 3103;
a first electrode 3104 formed on the interlayer insulating layer 1105, and the first flat layer 11021 is formed on the first electrode 3104; the first electrode 3104 is connected to the first gate 3103 through a via hole penetrating the interlayer insulating layer 1105.

The driving input unit of the first display area 100 includes:
a second gate 120 formed on the first gate insulating layer 11031 and provided in the same layer as the first gate 3103;
a second electrode 121 formed on the interlayer insulating layer 1105 and provided in the same layer as the first electrode 3104.

In this embodiment, the connecting wire for connecting the first electrode 3104 and the second electrode 121 include at least two wiring layers located in different layers. Taking four flat layers provided above the first electrode 3104 and the second electrode 121 as an example, as shown in FIGS. 8 to 10, the connecting wire connecting the first electrode 3104 and the second electrode 121 includes a fourth wiring layer 506 located on the first flat layer 11021, a fifth wiring layer 507 located on the second flat layer 11022, and a sixth wiring layer 508 on the third flat layer 11023. As shown in FIG. 5 to FIG. 7, the fourth wiring layer 506 and the first wiring layer 501 are in the same layer, and optionally, can be made by the same patterning process; the fifth wiring layer 507 and the second wiring layer 502 are in the same layer, and optionally, can be made by the same patterning process; the sixth wiring layer 508 and the third wiring layer 503 are in the same layer, and optionally, can be made by the same patterning process.

Wherein, in this embodiment, the first electrode 3104 and the second electrode 121 are connected through one of the wiring layers, and correspondingly, the wiring layer is respectively connected to the first electrode 3104 and the second electrode 121 through the via hole penetrating the flat layer.

For example, as shown in FIG. 8, part of the first electrode 3104 and the second electrode 121 are connected through a fourth wiring layer 506, and the fourth wiring layer 506 is respectively connected to the first electrode 3104 and the second electrode 121 through via holes penetrating the first flat layer 11021.

As shown in FIG. 9, part of the first electrode 3104 and the second electrode 121 are connected through the fifth wiring layer 507, which is respectively connected to the first electrode 3104 and the second electrode 121 through via holes penetrating the second flat layer 11022 and the first flat layer 11021 in sequence;

As shown in FIG. 10, part of the first electrode 3104 and the second electrode 121 are connected through a sixth wiring layer 508, which is respectively connected to the first electrode 3104 and the second electrode 121 through via holes penetrating the third flat layer 11023, the second flat layer 11022, and the first flat layer in sequence.

The above-mentioned at least two wiring layers located in different layers are used to realize a multi-layer connection to increase the number of light-emitting driving units 310 that can be controlled.

In the embodiment of the present disclosure, optionally, the connecting wire connecting the first electrode 3104 and the second electrode 121 is made of a transparent conductive material, that is, the fourth wiring layer 506, the fifth wiring layer 507, and the sixth wiring layer 508 mentioned above are all made of transparent conductive materials, such as ITO and/IZO.

In the embodiment of the present disclosure, optionally, the driving input unit may further include a third electrode. The third electrode is provided between the second electrode 121 and the second gate 120, the third electrode 122 is connected to the second gate 120 through a via hole, and the second electrode 121 is connected to the third electrode 122 through a via hole, that is, the driving input unit is formed as a double electrode structure. Wherein, when the driving input unit is formed as a double electrode structure, the connection between the second electrode 121 of the driving input unit and the first electrode 3104 of the light-emitting driving unit is the same as the above-mentioned embodiment, and will not be described one by one here.

Optionally, in this embodiment, the driving unit in the pixel unit 110 of the first display area 100 is multiplexed as the aforementioned driving input unit, that is, the pixel unit 110 of the first display area 100 can be used to input a driving control signal to the light-emitting driving unit 310. Specifically, the second electrode 121 in the driving input unit described above may be multiplexed by the source/drain of the pixel unit 110, and the second gate 120 may be multiplexed by the gate layer in the pixel unit 110.

Figure 11:
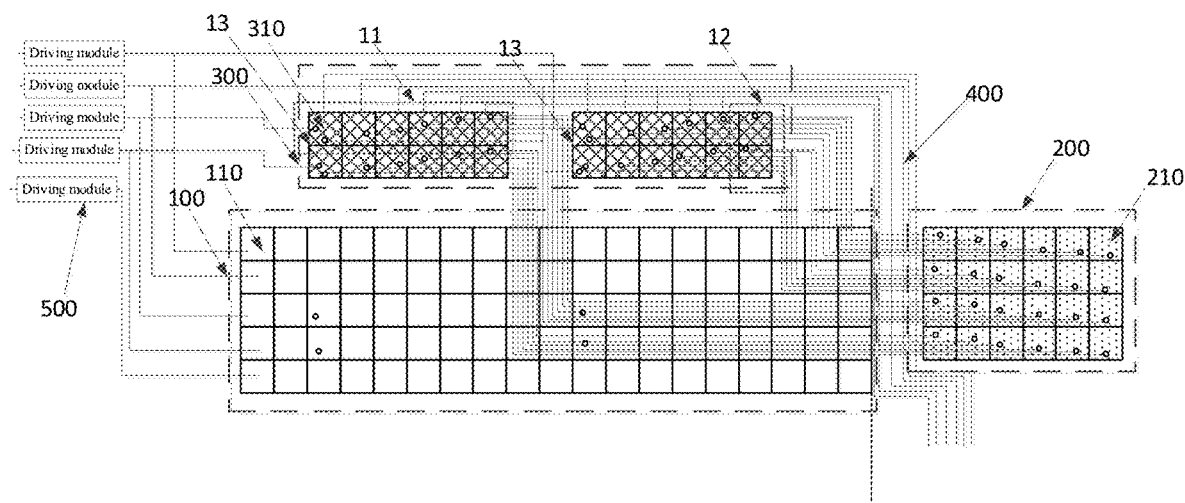
FIG. 11 is a schematic view of the connection structure of a third embodiment of the display panel according to the present disclosure.

In the embodiment of the present disclosure, in the above-mentioned embodiment, the connecting lead of the driving control signal of the light-emitting driving unit 310 is led out from the first display area 100. When the first display area 100 is formed, a connecting wire for inputting a driving control signal to the light-emitting driving unit 310 can be formed at the same time Optionally, the circuit for inputting the driving control signal of the light-emitting driving unit 310 is not limited to the above-mentioned embodiments. For example, the embodiment shown in FIG. 11 may also be used. Each unit row 11 including a plurality of light-emitting driving units 310 provided in the pixel auxiliary area 300 may be correspondingly connected to a driving module 500. The driving module 500 is located external to the first display area 100, the second display area 200 and the pixel auxiliary area 300, and is connected to a Gate Driver on Array (GOA) circuit for simultaneously inputting driving control signals to the pixel units 110 in the first display area 100 and the light-emitting driving units in the unit row 11. Among them, the specific implementation structure of the driving module 500 is not described in detail here.

The embodiments of the present disclosure further provide a display device, which includes the display panel as described in any one of the above.

With reference to FIGS. 1 to 11 and referring to the above detailed description, those skilled in the art should be able to understand the specific structure of the display device adopting the display panel of any one of the above embodiments, which will not be described in detail here.

Another aspect of the embodiments of the present disclosure further provides a manufacturing method of the display panel as described above, the method includes:

providing a transparent base substrate;
preparing a plurality of pixel units in a first area of the base substrate to form the first display area; preparing a plurality of transparent light-transmitting device units in a second area of the base substrate to form the second display area; and preparing a plurality of light-emitting driving units in a third area of the base substrate to form the third display area, and the light-emitting driving units are used to drive the connected light-emitting device units to emit light. In the embodiments of the present disclosure, when a plurality of pixel units are prepared in the first area, the light-emitting device unit in the second area and the light-emitting driving unit in the third area can be prepared at the same time, as well as the connection between the units.

The specific structures of the pixel unit, the light-emitting device unit, and the light-emitting driving unit, as well as the mutual structural relationship and the forming process relationship, can refer to FIG. 1 to FIG. 11 and the above detailed description, which will not be described here.

In the display panel, display device and manufacturing method thereof, by providing the light-emitting driving unit for driving the light-emitting device unit of the second display area to emit light in the area outside the first display area and the second display area, the area set corresponding the camera area only includes the light-emitting device unit, and the distribution density of the connecting wire for connecting the light-emitting device unit and the light-emitting driving unit in the display area is reduced, thereby solving the problem that in a display panel using an under-screen-camera in the prior art, it is difficult for the transparent display area corresponding to the camera to simultaneously satisfy the requirements for light transmission and display resolution.

Unless otherwise defined, the technical or scientific terms used in the present disclosure shall have the ordinary meanings understood by those of ordinary skill in the art to which the present disclosure belongs. The terms "first", "second", and the like used in this disclosure do not indicate any order, quantity, or priority, but are only used to distinguish different components. The terms "include", "have" or any variations thereof are intended to mean that an element or article followed by such a term encompasses a list of elements or articles preceded by such a term, or equivalents thereof, without precluding other elements or articles. Expressions such as "connection" or "connected" are not limited to physical or mechanical connections, but may include electrical connections, whether direct or indirect. Such words as "on", "under", "left" and "right" are merely used to represent relative position relationship, and when an absolute position of the object is changed, the relative position relationship will be changed too.

It will be understood that when an element, such as a layer, film, area or substrate, is referred to as being "on" or "under" another element, it can be directly on or directly under the other element, or intervening elements may also be present.

The specific features, structures, materials or characteristics in the description of forgoing implementations may be combined in any one or more embodiments or examples in proper manners.

The above descriptions merely describe specific implementations of the present disclosure, and the scope of the present disclosure is not limited thereto. Any modifications or substitutions easily occurring to a person of ordinary skill in the art without departing from the principle of the present disclosure shall fall within the scope of the present disclosure. Therefore, the scope of the present disclosure is defined by the scope of the claims.

What is claimed is:

1. A display panel, comprising:
   a first display area, provided with a plurality of pixel units;
   a second display area adjacent to the first display area, which is capable of transmitting light and provided with a plurality of light-emitting device units;
   a pixel auxiliary area external to the first display area and the second display area, which is provided with a plurality of light-emitting driving units;
   wherein, each light-emitting driving unit is configured to drive connected light-emitting device units to emit light;
   wherein the plurality of light-emitting driving units are connected in sequence and arranged as at least one unit row extending in a first direction, and each unit row is provided with at least one of the light-emitting driving units;
   wherein the first display area is further provided with a driving input unit corresponding to each unit row, and a driving control signal is input to the light-emitting driving units in a corresponding unit row through the driving input unit.

2. The display panel according to claim 1, wherein each light-emitting driving unit is correspondingly connected to one of the light-emitting device units; or, each light-emitting driving unit is correspondingly connected to at least two of the light-emitting device units.

3. The display panel according to claim 2, wherein the light-emitting device unit comprises a light-emitting layer, and a first terminal and a second terminal located on opposing sides of the light-emitting layer, and the light-emitting driving unit comprises an active layer and a driving electrode connected to the active layer, the driving electrode is connected to the first terminal through a connecting wire;

wherein the distance between the first terminal and the driving electrode is smaller than the distance between the second terminal and the driving electrode.

4. The display panel according to claim 3, wherein the connecting wire comprises at least two wiring layers located in different layers, the at least two wiring layers comprise at least a first wiring layer, a second wiring layer and a third wiring layer, wherein a first insulating layer is provided between the first terminal and the third wiring layer, and a second insulating layer is provided between the third wiring layer and the driving electrode;
the first terminal is connected to the third wiring layer through a via hole penetrating the first insulating layer, and the third wiring layer is connected to the driving electrode through a via hole penetrating the second insulating layer.

5. The display panel according to claim 4, wherein when the second wiring layer is provided above the first wiring layer and the first wiring layer is connected to the first terminal, a wiring adjustment layer is deposited between the first terminal and the connected first wiring layer on the first wiring layer, and the wiring adjustment layer and the second wiring layer above the first wiring layer are made by a same patterning process.

6. The display panel according to claim 3, wherein the connecting wire is made of transparent conductive material.

7. The display panel according to claim 1, wherein the plurality of light-emitting driving units are connected in sequence and arranged as at least one unit column extending in a second direction, and each unit column is provided with at least one of the light-emitting driving units; the first direction intersects with the second direction;
wherein each unit column is correspondingly connected to a data line, and the data line is used to input a data signal to the light-emitting driving units in the unit column.

8. The display panel according to claim 7, wherein each of the data lines surrounds a side edge of the first display area and/or the second display area and is connected to a respective light-emitting driving unit.

9. The display panel according to claim 7, wherein the plurality of the light-emitting driving units are arranged into at least two separate unit blocks, and each unit block comprises at least one unit row and/or at least one unit column.

10. The display panel according to claim 1, wherein a plurality of the light-emitting driving units in each unit row are respectively connected to a plurality of the light-emitting device units in a same row in the second display area in a one-to-one correspondence.

11. The display panel according to claim 1, wherein each unit row is connected to one of the driving input units through a driving wire group, and the driving wire group comprises at least two connecting wires for inputting a gate control signal, a reset control signal, and an EM control signal to the light-emitting driving unit in the unit row.

12. The display panel according to claim 11, wherein the light-emitting driving unit comprises a first gate and a first electrode connected to the first gate; the driving input unit comprises a second gate and a second electrode connected to the second gate;
the at least two connecting wires comprises at least two wiring layers located in different layers, wherein insulating layers are respectively provided between the first and second electrodes and the at least two wiring layers;
the first electrode and the second electrode are connected through one of the wiring layers, and the wiring layer connecting the first electrode and the second electrode connects the first electrode and the second electrode respectively through via holes penetrating the insulating layers.

13. The display panel according to claim 12, wherein the driving input unit further comprises a third electrode, where the second electrode is connected to the second gate through the third electrode.

14. The display panel according to claim 1, wherein the first display area surrounds the second display area, and the pixel auxiliary area is provided at one side edge of the first display area.

15. A display device, comprising the display panel according to claim 1.

16. A manufacturing method of the display panel according to claim 1, comprising:
providing a transparent base substrate;
preparing a plurality of pixel units in a first area of the base substrate to form the first display area; preparing a plurality of transparent light-transmitting device units in a second area of the base substrate to form the second display area; and preparing a plurality of light-emitting driving units in a third area of the base substrate to form the third display area, wherein the light-emitting driving units are connected to the light-emitting device units; wherein the light-emitting driving units are configured to drive respective light-emitting device units to emit light.

17. The display panel according to claim 11, wherein the at least two connecting wires are made of transparent conductive material.

* * * * *